(12) United States Patent
Ko

(10) Patent No.: US 6,933,217 B2
(45) Date of Patent: Aug. 23, 2005

(54) METHOD FOR FORMING A ROM CODING IN A SEMICONDUCTOR DEVICE

(75) Inventor: Ju-wan Ko, Gyunggi-Do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 198 days.

(21) Appl. No.: 10/274,563

(22) Filed: Oct. 21, 2002

(65) Prior Publication Data

US 2003/0077889 A1 Apr. 24, 2003

(30) Foreign Application Priority Data

Oct. 22, 2001 (KR) ........................................ 2001-65106

(51) Int. Cl.[7] ................. H01L 21/3205; H01L 21/4763
(52) U.S. Cl. ...................................... 438/586; 438/595
(58) Field of Search .................................. 438/586, 595

(56) References Cited

U.S. PATENT DOCUMENTS

| | | | |
|---|---|---|---|
| 5,527,730 A | * | 6/1996 | Kayaoka et al. ............ 438/256 |
| 6,157,069 A | | 12/2000 | Shin et al. |
| 6,207,999 B1 | * | 3/2001 | Wu ............................. 257/390 |
| 6,221,722 B1 | | 4/2001 | Lee |

OTHER PUBLICATIONS

Masuoka et al.; "An 80 ns 1 Mbit MASK ROM with a New Memory Cell"; pp. 651–657; IEEE Journal of Solid–State Circuits vol. SC–19, No. 5 Oct. 1984.*

* cited by examiner

Primary Examiner—George Fourson
Assistant Examiner—Fernando L. Toledo
(74) Attorney, Agent, or Firm—Marshall, Gerstein & Borun LLP

(57) ABSTRACT

Disclosed is a method for manufacturing a semiconductor device. The source/drain impurity area is formed by using the open base characteristic, the ion implantation of high density impurities for connecting source/drain is performed, the first contact hole, the non-crystalline poly-silicon layer and the PMD layer are formed consecutively, the ion implantation is performed, and then the metal lines are formed. Therefore, the size of the chip is reduced as the coding is performed by using the first contact hole without any coding area, the damage to the semiconductor substrate is reduced and the leakage current is reduced as the first contact hole is formed before the PMD layer, the ON characteristic can be achieved by the reverse type ion implantation to the OFF characteristic, which is contrary to the case of a current ROM coding techniques, and the cutting of the metal line is minimized as the poly-silicon layer is formed under the metal line layer during the deposition of the metal lines.

5 Claims, 5 Drawing Sheets

OFF TR      ON TR

METHOD FOR FORMING A ROM CODING IN A SEMICONDUCTOR DEVICE

BACKGROUND

1. Technical Field

A method for manufacturing a semiconductor device is disclosed wherein: a source/drain impurity area is formed by using open base characteristics; an ion implantation of high density impurities for connecting the source/drain is performed; a first contact hole, a non-crystalline poly-silicon layer and a plasma enhanced magnetron-sputtered deposition (PMD) layer are formed consecutively; an ion implantation is performed; and then metal lines are formed. As a result, the size of the chip is reduced as the coding is performed by using the first contact hole without any coding area, damage to the semiconductor substrate is reduced and the leakage current is reduced as the first contact hole is formed before the of PMD layer. Further, the ON characteristic can be achieved by the reverse type ion implantation to the OFF characteristic, which is contrary to the case of a general read only memory (ROM) coding, and cutting of the metal line is minimized as the poly-silicon layer is formed under the metal line layer during the deposition of the metal lines.

2. Description of the Related Art

In general, a mask ROM is composed of the combination of depletion type transistors and enhancement type transistors.

The depletion type transistor has a minus threshold voltage according to the implantation of depletion ions, and maintains an ON state while the zero voltage is applied to the gate electrode thereof.

The enhancement type transistor has the threshold voltage of about 0.7 volt as the channel area thereof is counter-doped by a code ion implantation of the depletion type transistor, so it functions as an OFF-transistor of the mask ROM.

FIG. 1A is a graph for illustrating the operational characteristic of a general depletion type transistor, and FIG. 1B is a graph for illustrating the operational characteristic of a general enhancement type transistor.

As shown in FIGS. 1A and 1B, the channel is formed in the depletion type transistor even without applying the voltage to the gate electrode, and the channel is formed in the enhancement type transistor only when a voltage greater than the threshold voltage is applied to the gate electrode.

Herein below, the conventional method for manufacturing the semiconductor device is described with reference to the accompanying drawings.

FIGS. 2A through 2D are sectional views showing the conventional method for manufacturing a semiconductor device. As shown in FIG. 2A, a field area and an active area are defined on an n-type semiconductor substrate 11, and a plurality of field oxidation layers 12 are formed at certain intervals by performing a field ion implantation on the field area.

A photo process and a depletion ion implantation are then performed on the entire surface of the semiconductor substrate 11 including the field oxidation layers 12.

Those processes are performed using arsenic (As) ions that are n-type impurities, since the channel has to be n-type in the NMOS depletion mode.

Then, as shown in FIG. 2B, a gate insulation layer 13 and a polycrystalline silicon layer are formed on the entire surface of the semiconductor substrate 11 including the field oxidation layers 12, and a plurality of gate insulation layers 13 and gate electrodes 14 are formed on the active area of the semiconductor substrate 11 by a patterning and through a photolithography process.

Afterwards, an insulation layer is deposited on the entire surface of the semiconductor substrate 11 including the gate electrodes 14, and then the etch back is performed to form sidewall spacers 15 on both sides of each gate electrode 14.

Then, source/drain impurity areas 16 are formed at both sides of the gate electrode 14 on the semiconductor substrate 11 through the source/drain ion implantation process using the gate electrodes 14 and the sidewall spacers 15 as a mask.

After that, as shown in FIG. 2C, a code ion implantation is performed according to the request of a customer, for which areas other than the gate electrodes 13 are masked to manufacture an OFF transistor.

In other words, a photoresist 17 is coated on the entire surface of the semiconductor substrate 11 including the gate electrodes 14, and patterning through the exposure and development processes is performed so that only the gate electrodes 14 needed to form the OFF transistor are exposed.

Then, the code ion implantation is performed through the gate electrodes 14 by using the patterned photoresist 17 as a mask.

Accordingly, as shown in FIG. 2D, as the photoresist 17 is removed, the OFF transistor implemented by the ON transistor and the coding ion implantation is manufactured, which is the completion of the data coding.

However, such a conventional ROM coding method which implants ions on the active area results in current leakage.

SUMMARY OF THE DISCLOSURE

A method for manufacturing a semiconductor device is disclosed wherein: the source/drain impurity area is formed by using the open base characteristics; the ion implantation of high density impurities for connecting source/drain is performed; the first contact hole, the non-crystalline poly-silicon layer and the PMD layer are formed consecutively; the ion implantation is performed; and then the metal lines are formed. As a result, the size of the chip is reduced as the coding is performed by using the first contact hole without any coding area. Further, the damage to the semiconductor substrate is reduced and the leakage current is reduced as the first contact hole is formed before the deposition of PMD. Also, the ON characteristic can be achieved by the reverse type ion implantation to the OFF characteristic, which is contrary to the case of a general ROM coding, and cutting of the metal line is minimized as the poly-silicon layer is formed under the metal line layer during the deposition of the metal lines.

A method for manufacturing a semiconductor device is disclosed which comprises: depositing a gate oxidation layer on a semiconductor substrate having a certain lower construction; forming a first contact hole for connecting elements electrically, by a wet etching of an area to be used as a ROM coding area on the gate oxidation layer; depositing a doped poly-silicon layer on a result formed with the first contact hole; forming a gate electrode and a first metal line by patterning a part of the poly-silicon layer to be used as a metal line; performing an ion implantation of low-density impurities connecting a source/drain area whereby the source/drain impurity areas are formed on both sides of the gate electrode on the semiconductor substrate; depositing a nitride layer on an entire surface of the semiconductor substrate and forming nitride spacers at both sides of the gate electrode by etching the nitride layer; masking a part for ROM coding on a result formed with the nitride spacers, and performing an ion implantation of high-density impurities on an area other than a ROM coding transistor; depositing a PMD on a result that the ion implantation of high-density impurities has been performed, and forming a second contact hole by a photolithography process; forming a resist pattern on a result formed with the second contact hole, and forming a ROM coding by ion implantation by using the resist pattern as a mask; and depositing a metal to be used as a metal line on the result, and forming a second metal line by patterning through a photolithography process.

In the preceding method, the depositing of the poly-silicon layer on the result formed with the first contact hole further comprises depositing a non-crystalline poly-silicon layer, and the first contact hole is formed before forming the gate electrode.

Furthermore, the first contact hole is formed by a wet etching that can minimize the damage to the upper side of the semiconductor substrate. It is possible that a poly-silicon layer used as the gate electrode be used in substitution for the poly-silicon layer that is a metal deposition layer for connecting the semiconductor device with the metal line. The thickness of the poly-silicon layer used as the first metal line ranges from about 2000 Å to about 4000 Å.

The step of forming the ROM coding by the ion implantation is performed with an energy ranging from about 50 KeV to about 100 KeV so that ions are not implanted to the source area and the drain area of the semiconductor device, and the first metal line is etched to about 1/10 its thickness thereof in the step of forming the second contact hole.

BRIEF DESCRIPTION OF THE DRAWINGS

Other objects and aspects of the disclosed methods will become apparent from the following description of the preferred embodiment with reference to the accompanying drawings wherein.

DETAILED DESCRIPTION OF THE PRESENTLY PREFERRED EMBODIMENTS

Figure 1A:
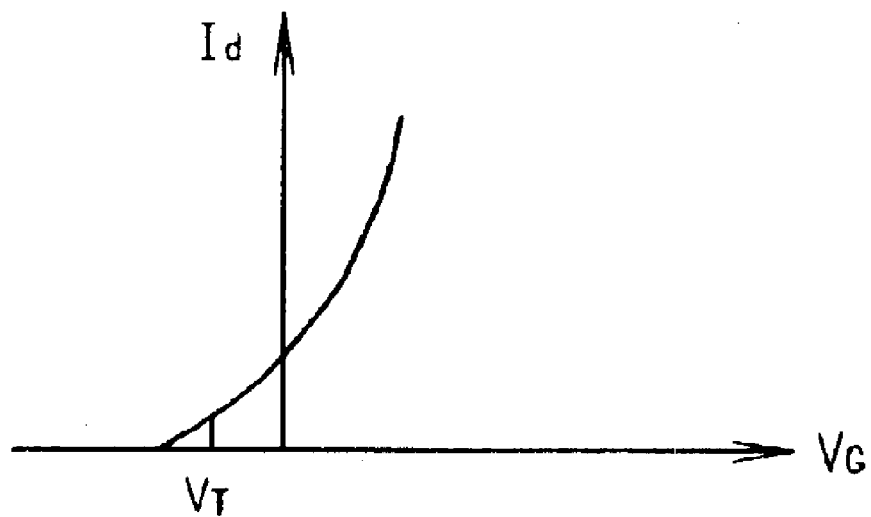
FIG. 1A is a graph for illustrating the operational characteristics of a general depletion type transistor.
Figure 1B:
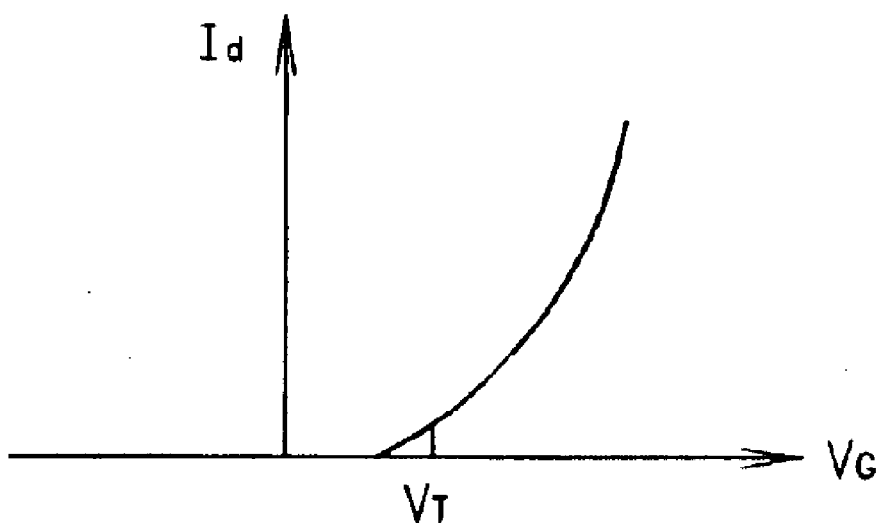
FIG. 1B is a graph for illustrating the operational characteristics of a general enhancement type transistor.
Figure 2A:
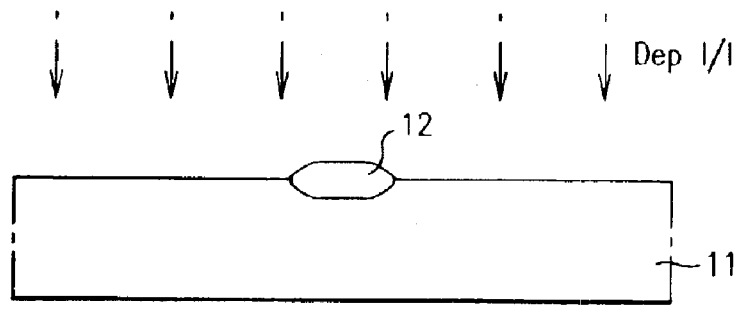
FIGS. 2A through 2D are sectional views showing the conventional method for manufacturing a semiconductor device.
Figure 2B:
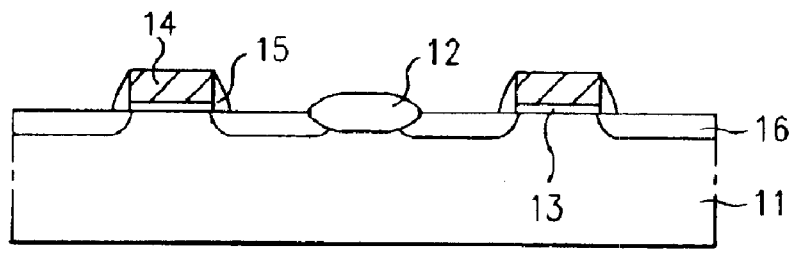
Figure 2C:
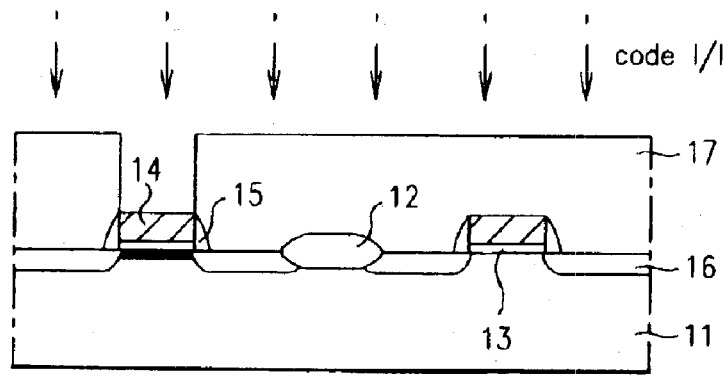
Figure 2D:
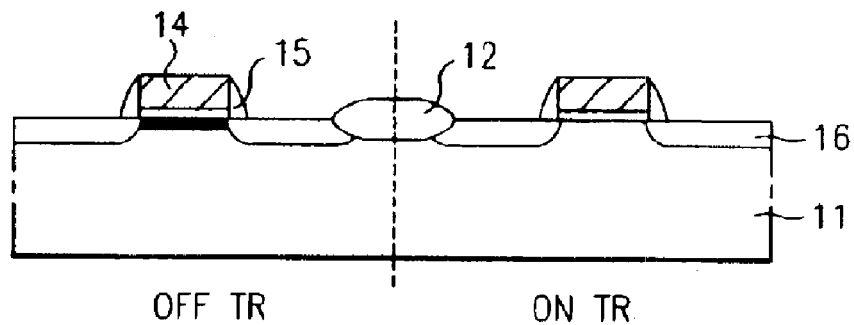

Hereinafter, the disclosed method will be described in more detail and with reference referring to the accompanying drawings. The embodiment is only an example and does not limit the scope of this disclosure, and the parts identical to those of the conventional art are referred to with the same reference numerals.

FIGS. 3A through 3G are sectional views showing the method for manufacturing a semiconductor device according to this disclosure.

Figure 3A:
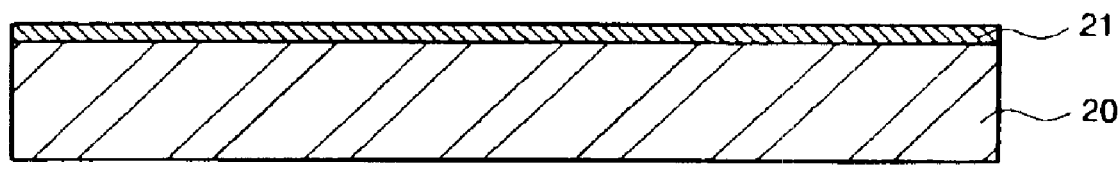
FIGS. 3A through 3G are sectional views showing the method for manufacturing a semiconductor device according to the present invention.
Figure 3B:
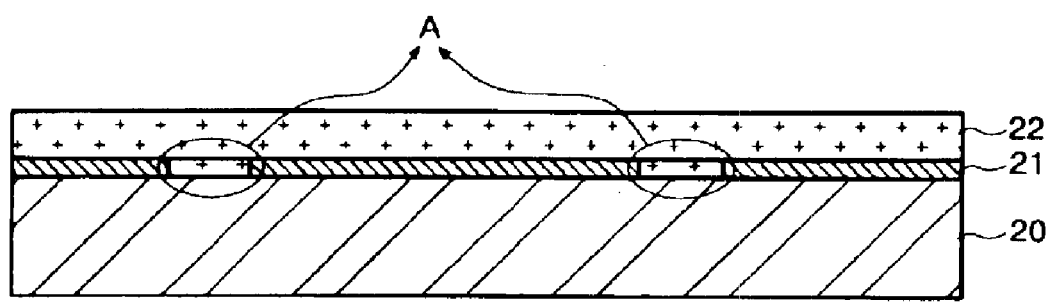

At first, as shown in FIG. 3A, a gate oxidation layer 21 is deposited on a semiconductor substrate 20. Then, as shown in FIG. 3B, the gate oxidation layer 21 is patterned through the photolithography process using a resist pattern (not shown) to form a first contact hole A which connects elements electrically, and a doped poly-silicon layer 22 that will be used as a first metal line and a ROM coding area is then deposited. In such a situation, the first contact hole A is formed by a wet etching of an area to be used as a ROM coding area on the gate oxidation layer 21. Further, the deposition of the poly-silicon layer 22 is performed by the deposition of a non-crystalline silicon layer. Moreover, the thickness of the poly-silicon layer 22 used as the first metal line ranges from about 2000 Å to about 4000 Å.

Figure 3C:
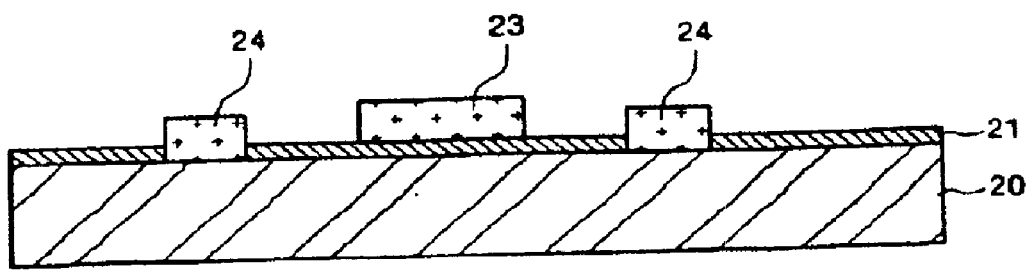

Next, as shown in FIG. 3C, gate electrodes 23 and first conductive lines 24 are formed by patterning the poly-silicon layer 22. A poly-silicon layer used as the gate electrode 23 can also be used for connecting the semiconductor device with the first conductive line 24.

Figure 3D:
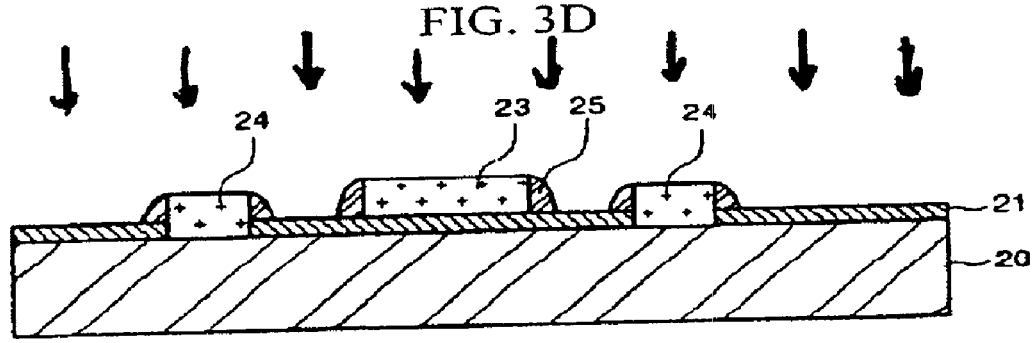

Then, as shown in FIG. 3D, source/drain impurity areas (not shown) are formed at both sides of the gate electrode 23 on the semiconductor substrate 20 by the ion implantation of low-density impurities for connecting the source/drain, using the resist pattern (not shown) as a mask, and next, a nitride layer is deposited on the entire surface of the semiconductor substrate 20, and nitride spacers 25 are formed at both sides of the gate electrode 23 by etching the entire surface. A part for ROM coding on a result formed with the nitride spacers 25 is then masked, and an ion implantation of high-density impurities is performed on an area other than a ROM coding transistor.

Figure 3E:
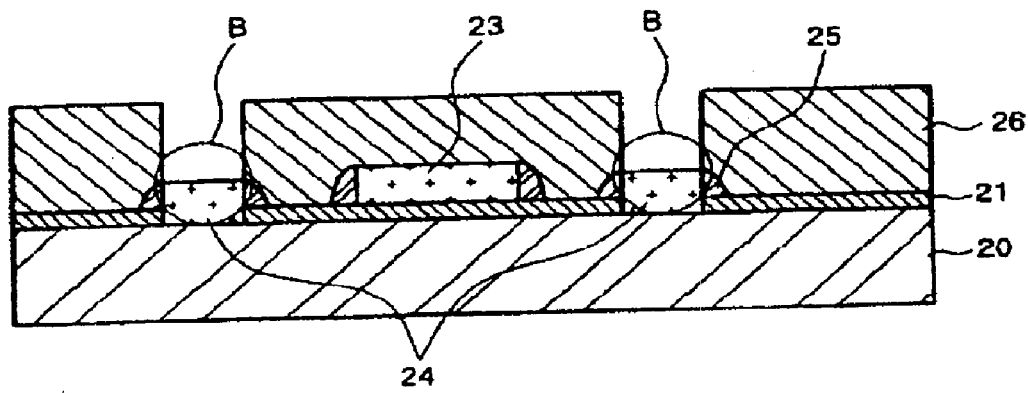

Then, as shown in FIG. 3E, PMD layer 26 for dividing the gates from the metal lines is deposited, and the second contact holes B are formed by a photolithography process. The first metal line 24 is etched to about a tenth of the thickness thereof in order to form the second contact hole B.

Figure 3F:
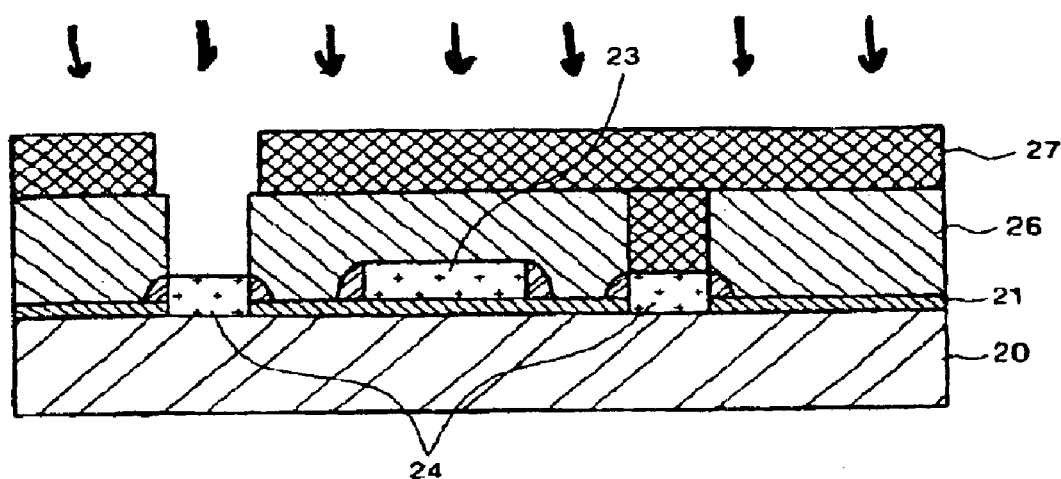
Figure 3G:
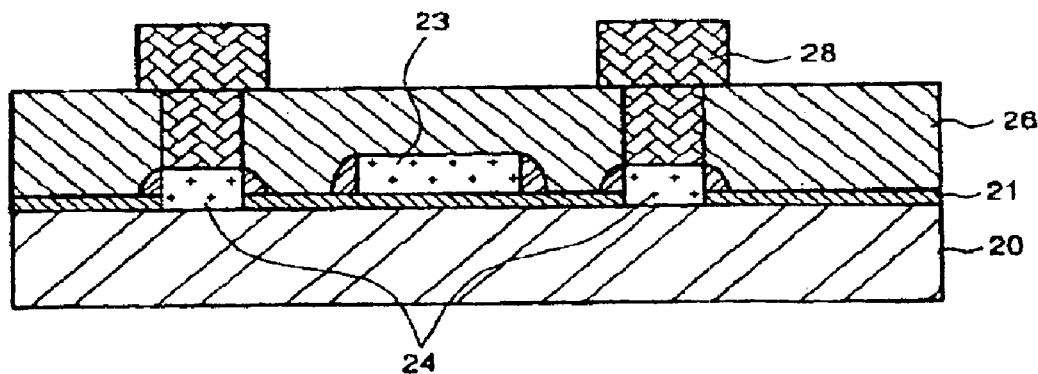

Then, as shown in FIG. 3F, a resist pattern 27 is formed, and an ion implantation is performed using the resist pattern 27 as a mask so as to form the ROM coding. Forming the ROM coding by the ion implantation is performed with an energy ranging from about 50 KeV to about 100 KeV so that ions are not implanted to the source area and the drain area of the semiconductor device. After that, as shown in FIG. 3G, a metal to be used as the second metal lines is deposited, and then is patterned through the photolithography process. As a result, the second metal line 28 is thus formed.

In such a situation, the OFF characteristic of the ROM transistor is converted to the ON characteristic by an ion implantation having the same type as the source/drain area on a predetermined area during the coding.

The ROM coding is performed by using the contact hole on the basis of the open base characteristics, so a separate area requiring the coding is not needed and therefore the size of the chip can be reduced. Furthermore, as the first contact hole is formed before the PMD layer, the damage to the semiconductor substrate is prevented and leakage of the current of the semiconductor device can be prevented.

As described above, the source/drain impurity area is formed by using the open base characteristics, the ion implantation of high density impurities for connecting the source/drain is performed, the first contact hole, the non-crystalline poly-silicon layer and the PMD layer are formed consecutively, the ion implantation is performed, and then the metal lines are formed. Therefore the chip size is reduced as the coding is performed by using the first contact hole without any coding area, damage to the semiconductor substrate is reduced and the leakage current is reduced as the first contact hole is formed before the PMD layer, the ON characteristic can be achieved by the reverse type ion implantation to the OFF characteristic, which is contrary to the case of a general ROM coding, and the cutting of the metal line is minimized as the poly-silicon layer is formed under the metal line layer during the deposition of the metal lines.

Although a preferred embodiment has been described, it will be understood by those skilled in the art that this disclosure should not be limited to the described preferred embodiment, but that various changes and modifications can be made within the spirit and the scope of this disclosure. Accordingly, the scope of this disclosure is not limited by the above description but by the following claims.

What is claimed is:

1. A method for manufacturing a semiconductor device comprises:

depositing a gate oxidation layer on a semiconductor substrate having a lower construction;

forming a first contact hole for connecting elements electrically, by a wet etching of an area to be used as a ROM coding area on the gate oxidation layer;

depositing a doped poly-silicon layer on a result formed with the first contact hole;

forming a gate electrode and a first conductive line by patterning a part of poly-silicon layer to be used as a conductive line;

performing an ion implantation of low-density impurities connecting a source/drain area whereby the source/drain impurity areas are formed on both sides of the gate electrode on the semiconductor substrate;

depositing a nitride layer on an entire surface of the semiconductor substrate and forming nitride spacers at both sides of the gate electrode by etching the nitride layer;

making a part for ROM coding on a result formed with the nitride spacer, and performing an ion implantation of high density impurities on an area other than a ROM coding transistor;

depositing a PMD layer on the resulting structure and forming a second contact hole by a photolithography process;

forming a resist pattern on the result formed with the second contact hole, and forming a ROM coding by ion implantation by using the resist pattern as a mask; and depositing a metal to be used as a metal line on the result, and forming a second metal line by patterning through a photolithography process.

2. The method for manufacturing a semiconductor device of claim 1, wherein the depositing of the doped poly-silicon layer on the result formed with the first contact hole further comprises depositing a non-crystalline silicon layer.

3. The method for manufacturing a semiconductor device of claim 1, wherein an original thickness of the poly-silicon layer used for the first conductive line ranges from about 2000 Å to about 4000 Å.

4. The method for manufacturing a semiconductor device of claim 1, wherein the step of forming the ROM coding by the ion implantation is performed with an energy ranging from about 50 KeV to about 100 KeV.

5. The method for manufacturing a semiconductor device of claim 3, wherein the first conductive line is etched to about a tenth of its original thickness during the forming of the second contact hole.

* * * * *

UNITED STATES PATENT AND TRADEMARK OFFICE
CERTIFICATE OF CORRECTION

PATENT NO. : 6,933,217 B2 Page 1 of 1
APPLICATION NO. : 10/274563
DATED : August 23, 2005
INVENTOR(S) : Ju-wan Ko It is certified that error appears in the above-identified patent and that said Letters Patent is hereby corrected as shown below:

At column 1, line 20, "formed before the of PMD layer" should be -- formed before the PMD layer --.

At column 4, line 12, "lines" should be -- line --.

In the Claims:

In Claim 1, column 6, lines 1-4, please delete "nitride spacer" and insert --nitride spacers--.

Signed and Sealed this

Twelfth Day of December, 2006

JON W. DUDAS
*Director of the United States Patent and Trademark Office*